(12) United States Patent
Zhou et al.

(10) Patent No.: US 9,412,734 B2
(45) Date of Patent: Aug. 9, 2016

(54) STRUCTURE WITH INDUCTOR AND MIM CAPACITOR

(71) Applicant: UNITED MICROELECTRONICS CORP., Hsin-Chu (TW)

(72) Inventors: Zhibiao Zhou, Singapore (SG); Shao-Hui Wu, Singapore (SG); Chi-Fa Ku, Kaohsiung (TW)

(73) Assignee: UNITED MICROELECTORINCS CORP., Hsin-Chu (TW)

( * ) Notice: Subject to any disclaimer, the term of this patent is extended or adjusted under 35 U.S.C. 154(b) by 0 days.

(21) Appl. No.: 14/588,991

(22) Filed: Jan. 5, 2015

(65) Prior Publication Data

US 2016/0163693 A1 Jun. 9, 2016

(30) Foreign Application Priority Data

Dec. 9, 2014 (CN) .......................... 2014 1 0748125

(51) Int. Cl.
*H01L 27/06* (2006.01)
*H01L 49/02* (2006.01)

(52) U.S. Cl.
CPC ............ *H01L 27/0629* (2013.01); *H01L 28/10* (2013.01); *H01L 28/60* (2013.01)

(58) Field of Classification Search
CPC ...... H01L 27/0629; H01L 28/10; H01L 28/60
See application file for complete search history.

(56) References Cited

U.S. PATENT DOCUMENTS

| | | | |
|---|---|---|---|
| 6,329,234 B1 | 12/2001 | Ma | |
| 6,387,750 B1 | 5/2002 | Lai | |
| 6,387,775 B1 | 5/2002 | Jang | |
| 6,593,185 B1 | 7/2003 | Tsai | |
| 6,639,298 B2 | 10/2003 | Chaudhry | |
| 7,365,627 B2 | 4/2008 | Yen | |
| 8,221,962 B2 * | 7/2012 | Takahashi | ............ H01F 41/041 430/315 |
| 2005/0266633 A1 | 12/2005 | Gau | |
| 2006/0022787 A1 | 2/2006 | Brennan | |
| 2010/0225435 A1 | 9/2010 | Li | |
| 2015/0280785 A1 * | 10/2015 | Brauchler | ............ H04B 5/0018 257/531 |

* cited by examiner

*Primary Examiner* — Whitney T Moore
(74) *Attorney, Agent, or Firm* — Winston Hsu; Scott Margo

(57) ABSTRACT

A structure with an inductor and a MIM capacitor is provided. The structure includes a dielectric layer, an inductor and a MIM capacitor. The inductor and the MIM capacitor are disposed within the dielectric layer. The inductor includes a core and a wire surrounding the core. The MIM capacitor includes a top electrode, a bottom electrode and an insulating layer. The top electrode or the bottom electrode includes a material which forms the core.

14 Claims, 14 Drawing Sheets

STRUCTURE WITH INDUCTOR AND MIM CAPACITOR

BACKGROUND OF THE INVENTION

1. Field of the Invention

The present invention relates to a structure with an inductor and a metal-insulator-metal (MIM) capacitor and a method of fabricating the same, and more particularly relates to a method and a structure of using the same material to form the core of the inductor and the bottom electrode of the MIM capacitor.

2. Description of the Prior Art

Due to increased complexities in modern day electronic devices, miniaturization has become increasingly important. This is particularly true where complex electronic circuitry is to be used for telecommunications and multimedia purposes.

Telecommunications and multimedia require RF devices, in which capacitors and inductors are often used, and frequently appear either in integrated form or as individual components.

A novel method which can combine the fabricating steps of capacitors and inductors is needed so as to reduce fabricating time and costs.

SUMMARY OF THE INVENTION

In view of the above, an objective of the present invention is to provide a method and a structure that can combine the fabricating steps of capacitors and inductors.

According to a preferred embodiment of the present invention, a structure with an inductor and an MIM capacitor includes a dielectric layer, an inductor and a MIM capacitor. The inductor is disposed within the dielectric layer. The inductor includes a core and a wire surrounding the core. The MIM capacitor includes a top electrode, a bottom electrode and an insulating layer disposed between the top electrode and the bottom electrode. One of the top electrode and the bottom electrode comprises a material composing the core.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 and FIG. 8 to FIG. 13 are schematic drawings illustrating a method for fabricating a structure with an inductor and a MIM capacitor according to a second preferred embodiment of the present invention.

DETAILED DESCRIPTION

Figure 14:
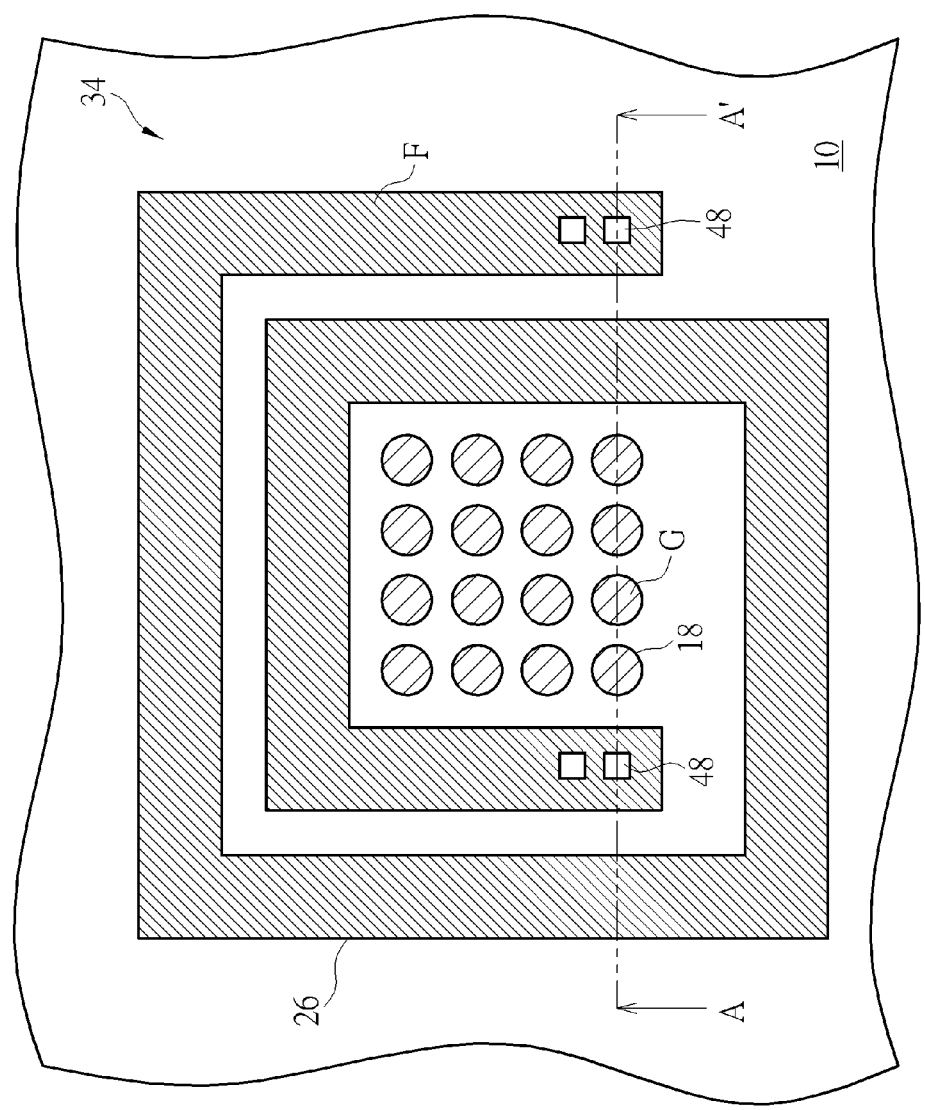
FIG. 14 is a schematic drawing illustrating a top view of an inductor region illustrated in FIG. 7.

FIG. 1 to FIG. 7 are schematic drawings illustrating a method for fabricating a structure including an inductor and an MIM capacitor according to a first preferred embodiment of the present invention. FIG. 14 is a schematic drawing illustrating a top view of an inductor region shown in FIG. 7.

Figure 1:
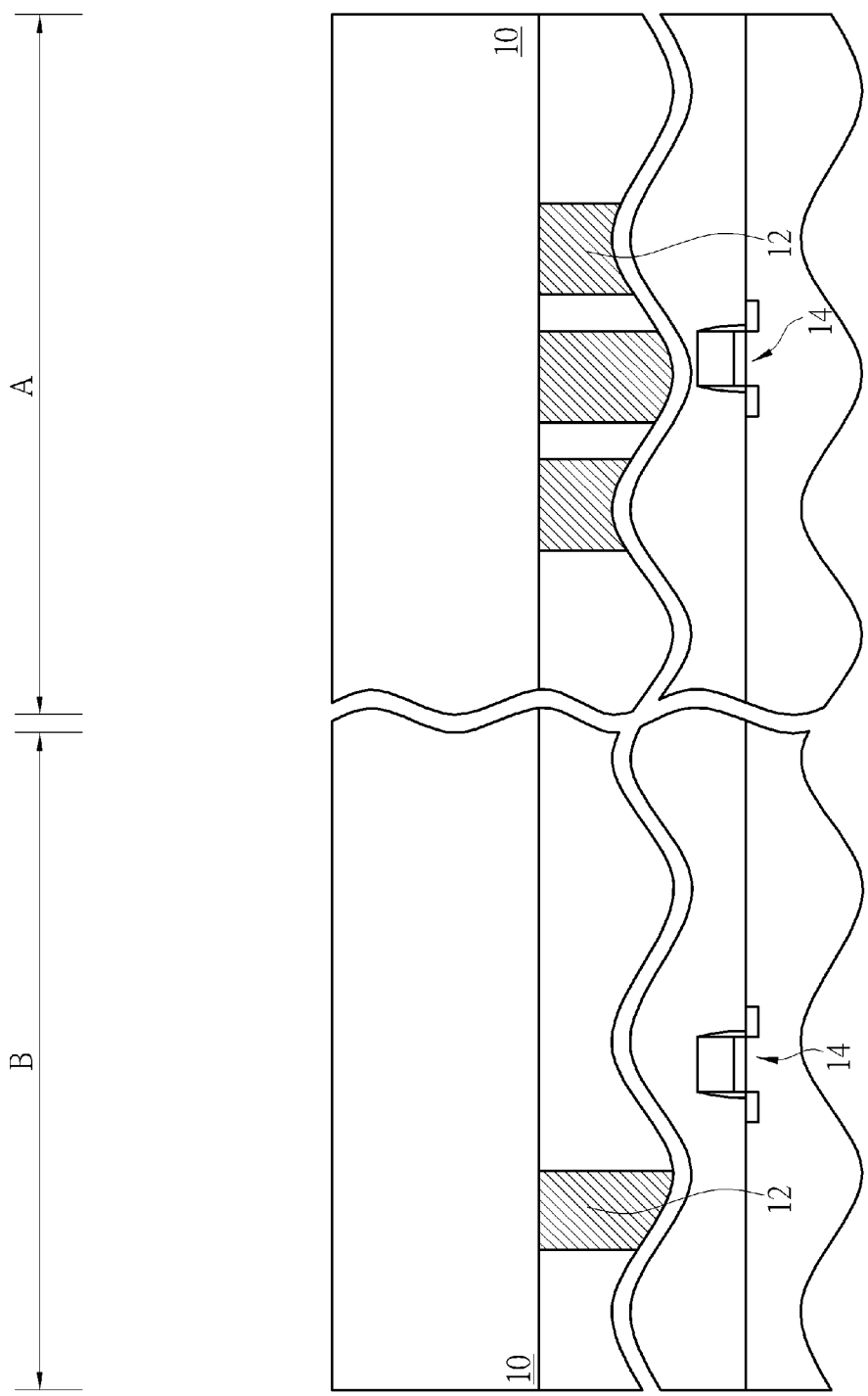
FIG. 1 to FIG. 7 are schematic drawings illustrating a method for fabricating a structure with an inductor and a MIM capacitor according to a first preferred embodiment of the present invention.

As shown in FIG. 1, a dielectric layer 10 is provided. The dielectric layer 10 is divided into a capacitor region A and an inductor region B. Before forming the dielectric 10, a metal layer 12 can be formed to make the dielectric layer 10 cover and be disposed on the metal layer 12. According to a preferred embodiment of the present invention, a transistor 14 may be formed below the metal layer 12 before the metal layer 12 is formed. That is, the fabricating method of the present invention is preferably performed after the transistor 14 is completed. The present invention is not limited to this sequence, however. According to another preferred embodiment, the fabricating method of the present invention may be applied to an interposer; more specifically, to form the inductor and the MIM capacitor into the interposer. In this case, the fabricating method of the present invention may be performed before or after the transistor 14 is completed.

Figure 2:
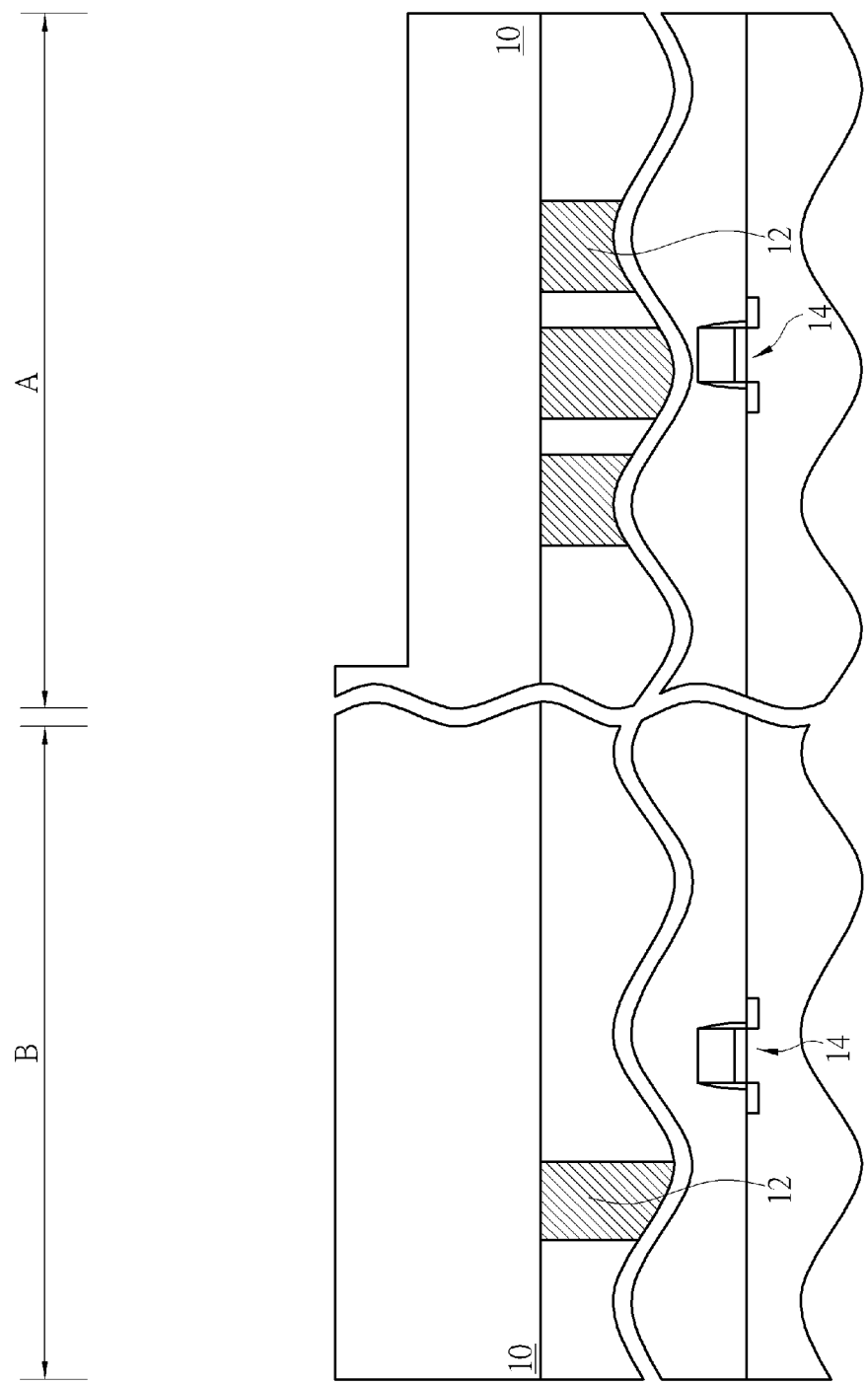
Figure 3:
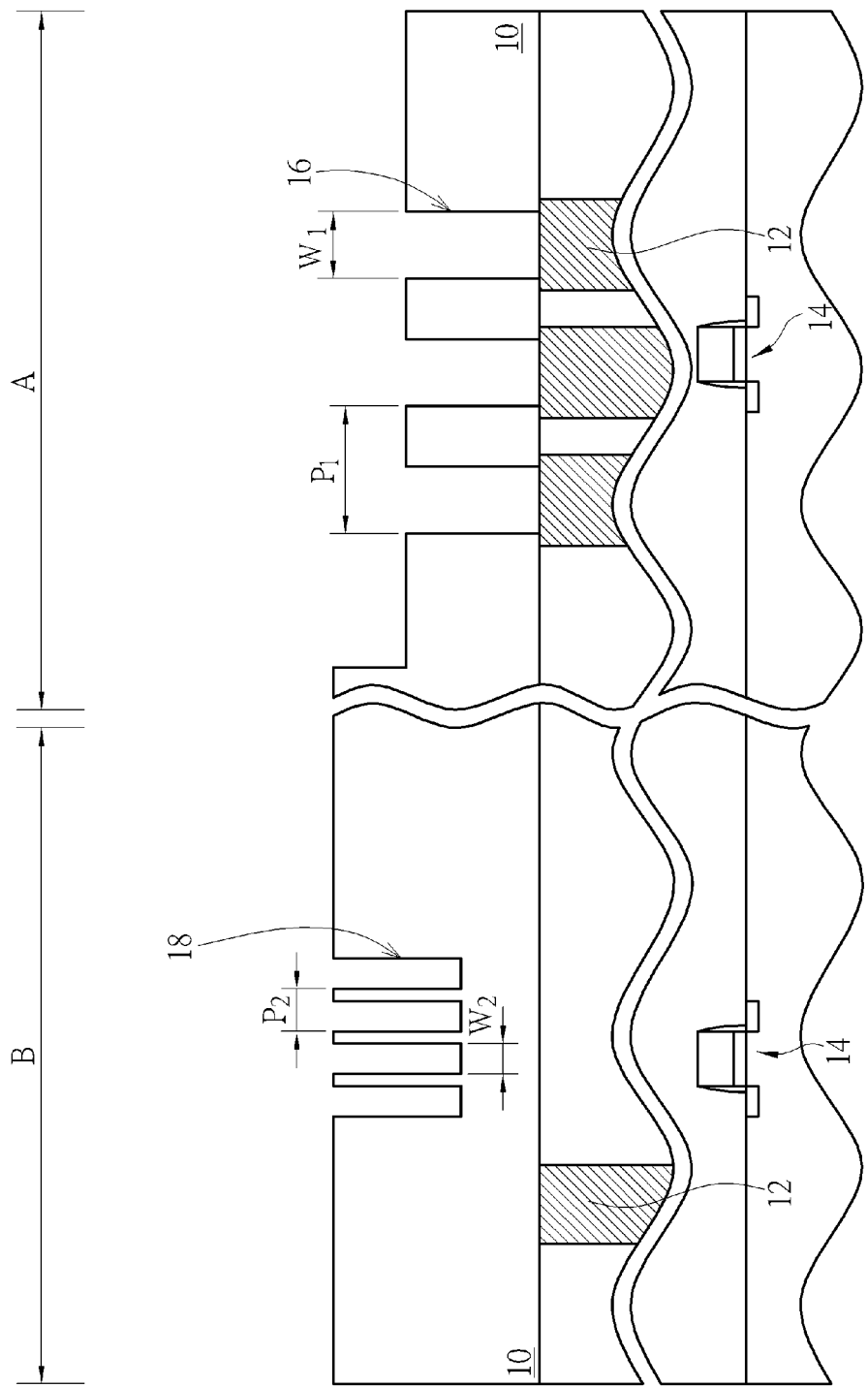

As shown in FIG. 2, part of the capacitor region A of the dielectric layer 10 is optionally removed to make the top surface of capacitor region A of the dielectric layer 10 be lower than the top surface of the inductor region B of the dielectric layer 10. Later, as shown in FIG. 3, at least a first trench 16 and at least a second trench 18 are simultaneously formed in the capacitor region A of the dielectric layer 10 and the inductor region B of the dielectric layer 10 respectively. According to a preferred embodiment, there are numerous first trenches 16 and the second trenches 18. The pitch $P_1$ of the first trenches 16 is greater than the pitch $P_2$ of the second trenches 18. Moreover, the width $W_1$ of the first trench 16 is greater than the width $W_2$ of the second trench 18. The numbers of the first trenches 16 and the second trenches 18 are only for exemplary purposes; the numbers of the first trenches 16 and the second trenches 18 can be adjusted based on different requirements. Furthermore, the entire first trench 16 penetrates the dielectric layer 10 to expose the metal layer 12 through the first trenches 16, but the second trenches 18 do not penetrate the dielectric layer 10. That is, the bottom of each of the second trenches 18 is the dielectric layer 10.

Figure 4:
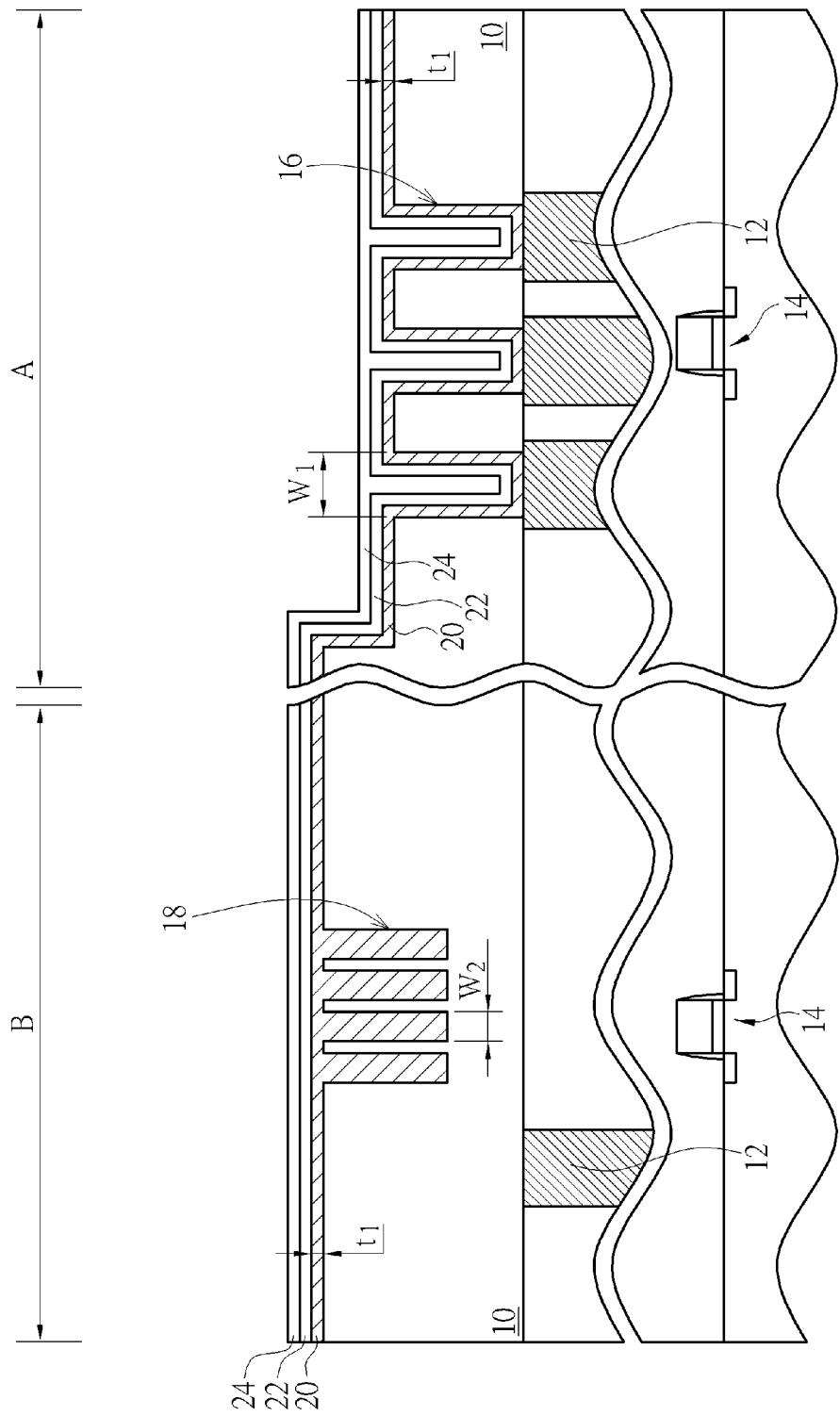

As shown in FIG. 4, a magnetic material 20 is formed to comformally cover the first trench 16 and the top surface of the dielectric layer 10 and to fill up the second trench 18. According to a preferred embodiment of the present invention, the magnetic material 20 has a thickness $t_1$. The thickness $t_1$ is greater than or equal to half the width $W_2$ of the second trench 18. Therefore, the magnetic material 20 can fill up the second trench 18. The thickness $t_1$ is smaller than half the width $W_1$ of the first trench 16. Therefore, the magnetic material 20 does not fill up the first trench 16. The magnetic material 20 is preferably conductive magnetic materials, ferrites, or alloys. For example, the magnetic material 20 may include ferrites such as MnZn, CuZn, or NiZn. The magnetic material 20 may also include alloys such as Ni—Fe—Mo or Fe—Co—Ni. The magnetic material 20 may also include FeSi, FeAl or FeSiAl. It is noteworthy that the magnetic material 20 in the first trench 16 will serve as a bottom electrode of the MIM capacitor. The magnetic material 20 in the second trench 18 will serve as the core of the inductor afterwards. Later, an insulating layer 22 is formed conformally to cover the magnetic material 20 within the capacitor region A and the inductor region B. Then, a conductive layer 24 is formed to cover the insulating layer 22. At this point, the magnetic material 20, the insulating layer 22 and the conductive layer 24 fill up the first trench 16. The insulating layer 22 will serve as an insulating layer of the MIM capacitor later. The conductive layer 24 serves as a top electrode of the MIM capacitor afterwards.

According to a preferred embodiment of the present invention, a barrier (not shown) can be formed between the magnetic material 20 and the insulating layer 22, and formed between the insulating layer 22 and the conductive layer 24.

The barrier preferably utilizes materials with low resistance and low magnetic loss. For example, TiN can be used as the barrier. The barrier can make the magnetic material 20, the insulating layer 22 and the conductive layer 24 attach to each other better. Moreover, the barrier attached on the magnetic material 20 can serve as part of the bottom electrode to help the magnetic material 20 to provide suitable conductivity.

Figure 5:
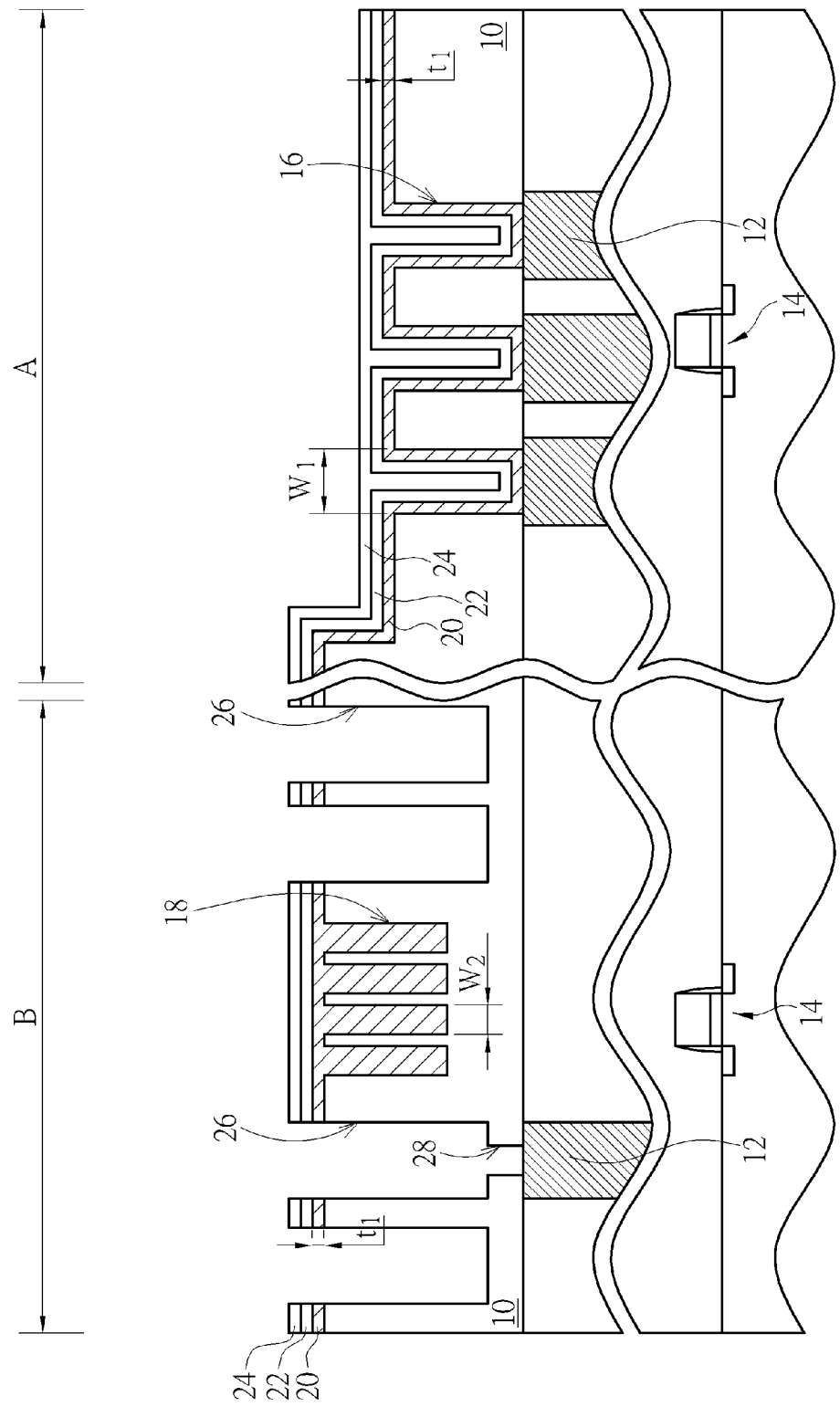

As shown in FIG. 5, the magnetic material 20, the insulating layer 22, the conductive layer 24 and the dielectric layer 10 within the inductor region B are removed partly by using a single damascene or dual damascene to form a third trench 26 in the inductor region B of the dielectric layer 10. The third trench 26 segments the magnetic material 20, the insulating layer 22 and the conductive layer 24 within the inductor region B. Please refer to FIG. 5 and FIG. 14. The third trench 26 surrounds the second trench 18 in a spiral manner. The second trench is at the center of the spiral. The spiral is continuous. The spiral can be a rectangular spiral, a circular spiral, an octagonal spiral, etc. Later, a contact hole 28 is formed at the bottom of the trench 26 and at an end of the spiral. The metal layer 12 is exposed through the metal layer 12. A contact plug will be formed in the contact hole 28 later.

Figure 6:
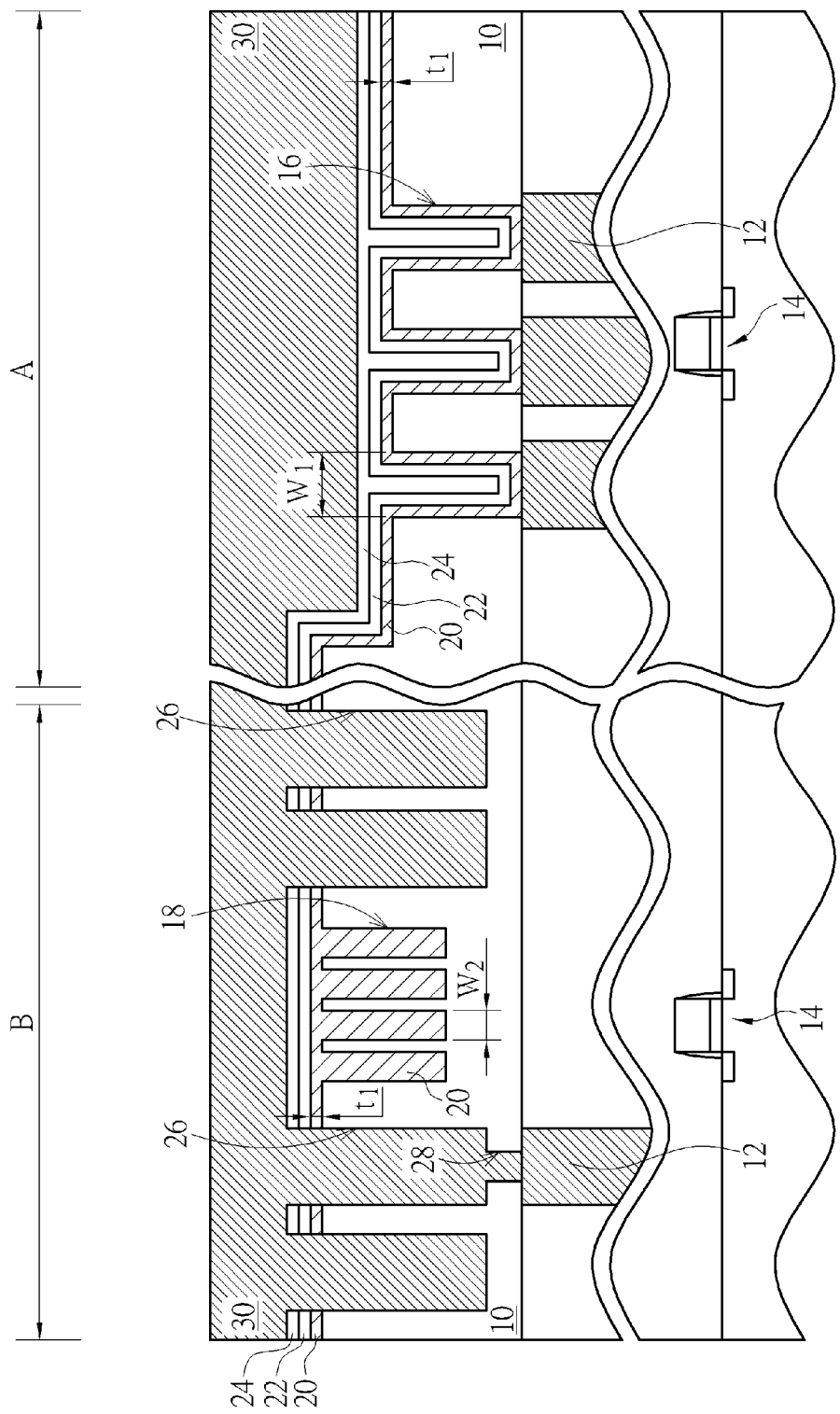
Figure 7:
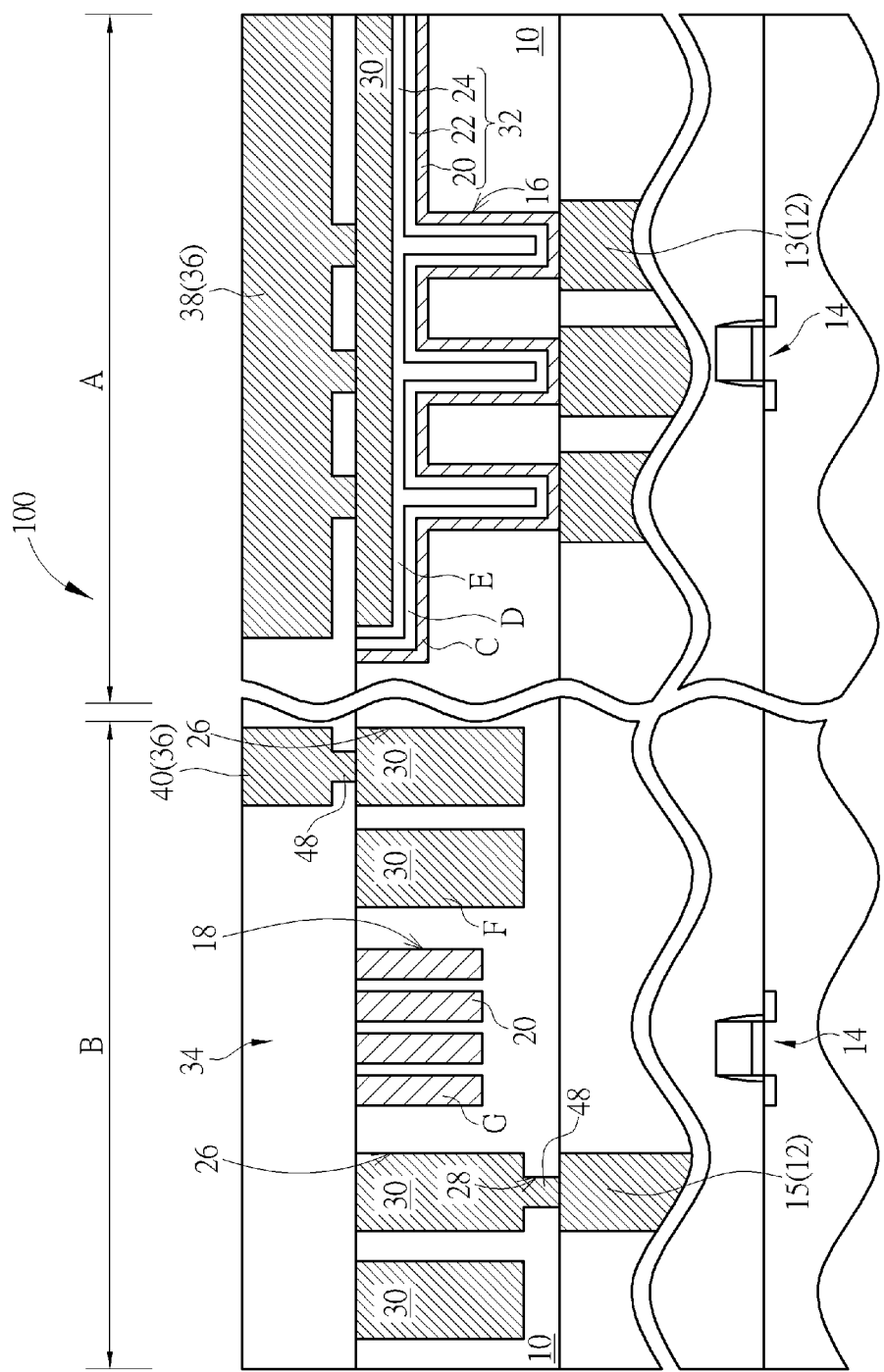

As shown in FIG. 6, a metal layer 30 is formed to fill in the third trench 26 and the contact hole 28. The metal layer 30 also covers and contacts the conductive layer 24. The metal layer 30 filling in the third trench 26 will serve as a wire of the inductor. The metal layer 30 filling in the contact hole 28 will serve as a contact plug. The contact plug contacts the metal layer 12, and sends the electric signal into the wire. As shown in FIG. 7, the magnetic material 20, the insulating layer 22 and the conductive layer 24 within the inductor region B are entirely removed and the magnetic material 20, the insulating layer 22 and the conductive layer 24 within the capacitor region A are partly removed. The magnetic material 20 in the second trench 18 is exposed. After part of the metal layer 30 is removed, the remaining metal layer 30 within the capacitor region A and within the inductor region B is disconnected. The metal layer 30 may be removed by chemical mechanical planarization or other suitable process. At this point, the magnetic material 20, the insulating layer 22 and the conductive layer 24 within the capacitor region A constitute a MIM capacitor 32. The magnetic material 20 serves as a bottom electrode C. The insulating layer 22 serves as a capacitor insulating layer D. The conductive layer 24 serves as a top electrode E. The magnetic material 20 and the metal layer 30 filling in the third trench 26 constitute an inductor 34. The magnetic material 20 serves as a core G. The metal layer serves as a wire F. Later, a metal layer 36 is formed on the dielectric layer 10. The metal layer 36 includes circuits 38 and circuits 40. The circuits 38 electrically connect to the top electrode E of the MIM capacitor 32. The circuits 40 contact an end of the wire F.

FIG. 1 and FIG. 8 to FIG. 13 are schematic drawings illustrating a method for fabricating a structure with an inductor and a MIM capacitor according to a second preferred embodiment of the present invention, wherein like reference numerals are used to refer to like elements throughout. As shown in FIG. 1, a dielectric layer 10 is provided. The dielectric layer 10 is divided into a capacitor region A and an inductor region B. Before forming the dielectric 10, a metal layer 12 can be formed so the dielectric layer 10 can cover and be disposed on the metal layer 12. According to a preferred embodiment of the present invention, a transistor 14 may be formed below the metal layer 12 before the metal layer 12 is formed. That is, the fabricating method of the present invention is preferably performed after the transistor 14 is completed. The present invention is not limited to this sequence, however. According to another preferred embodiment, the fabricating method of the present invention may be applied to an interposer; more specifically, to form the inductor and the MIM capacitor into the interposer. In this case, the fabricating method of the present invention may be performed before or after the transistor 14 is completed.

Figure 8:
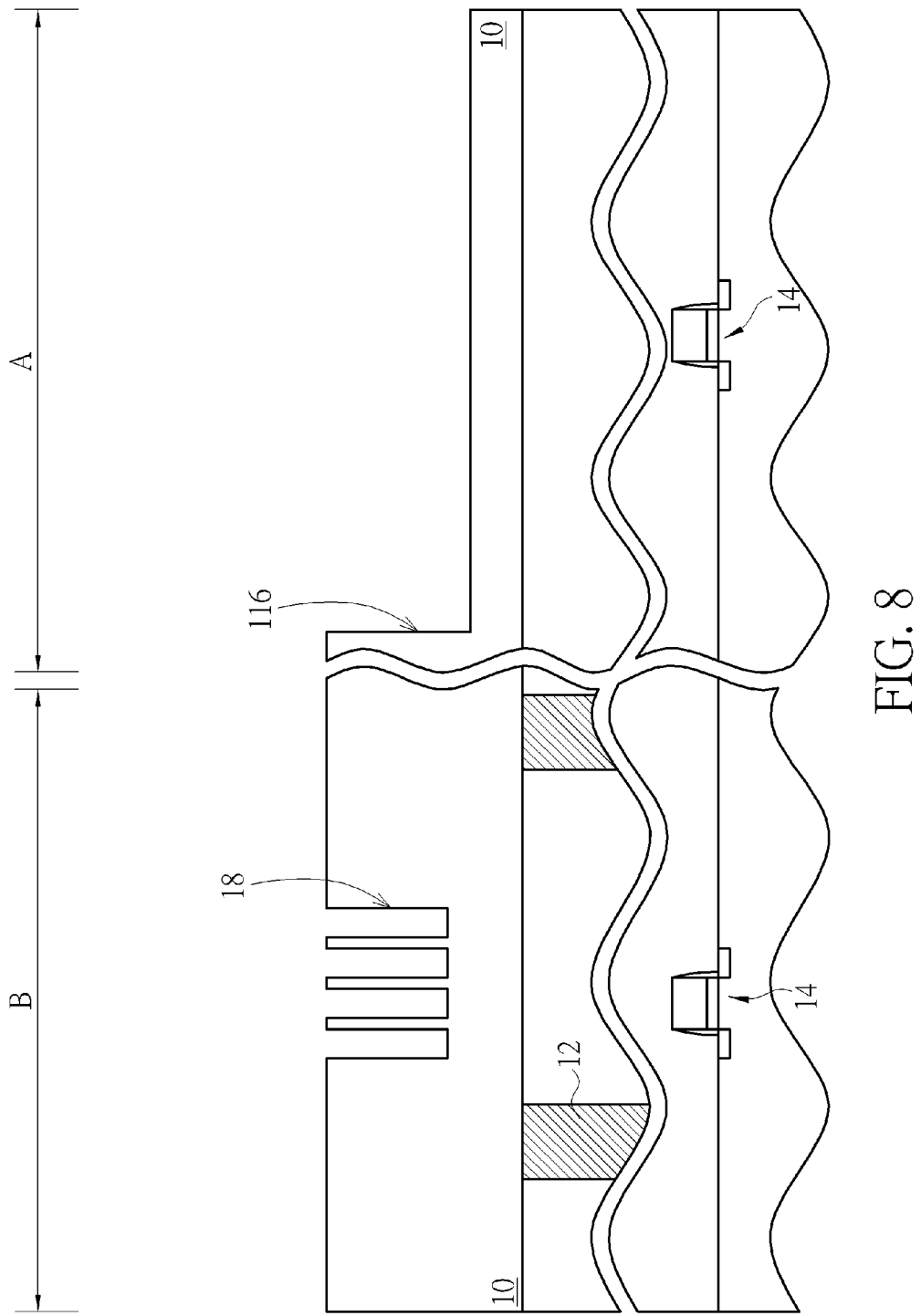

As shown in FIG. 8, a recess 116 and at least a second trench 18 are simultaneously formed within the capacitor region A of the dielectric layer 10 and the inductor region B of the dielectric layer 10. The recess 116 and the second trench 18 can be formed by an etching process. The numbers of the second trench 18 can be adjusted based on different requirements. In this embodiment, there are numerous second trenches 18. In addition, the metal layer 12 is still covered by the dielectric layer 10 after the recess 116 and the second trench 18 are formed. That is, the second trenches and the recess 116 do not penetrate the dielectric layer 10.

Figure 9:
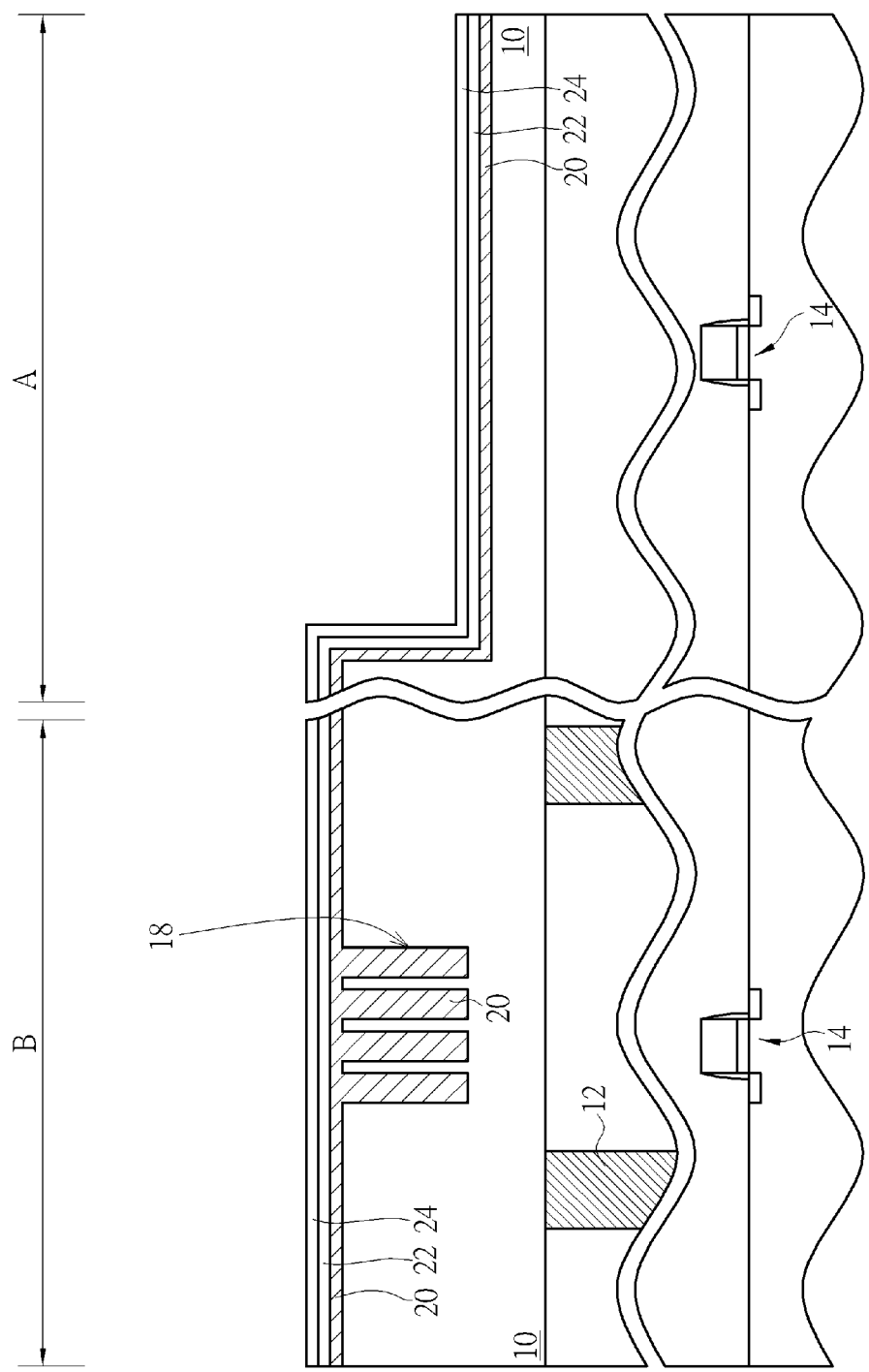

As shown in FIG. 9, a magnetic material 20 is formed to comformally cover the recess 116 and the top surface of the dielectric layer 10, and to fill up the second trench 18. Similarly, the magnetic material 20 is preferably conductive magnetic materials, ferrites, alloys or other suitable materials. For example, the magnetic material 20 may include ferrites such as MnZn, CuZn, or NiZn. The magnetic material 20 may also include alloys such as Ni—Fe—Mo or Fe—Co—Ni. The magnetic material 20 may also include FeSi, FeAl or FeSiAl. The magnetic material 20 in the recess 116 will serve as a bottom electrode of the MIM capacitor. The magnetic material 20 in the second trenches 18 will serve as the core of the inductor afterwards. Later, an insulating layer 22 is formed conformally to cover the magnetic material 20 within the capacitor region A and the inductor region B. Then, a conductive layer 24 is formed to cover the insulating layer 22. The insulating layer 22 will serve as a capacitor insulating layer of the MIM capacitor later. The conductive layer 24 serves as a top electrode of the MIM capacitor afterwards. According to a preferred embodiment of the present invention, a barrier (not shown) such as TiN can be formed between the magnetic material 20 and the insulating layer 22, and formed between the insulating layer 22 and the conductive layer 24.

Figure 10:
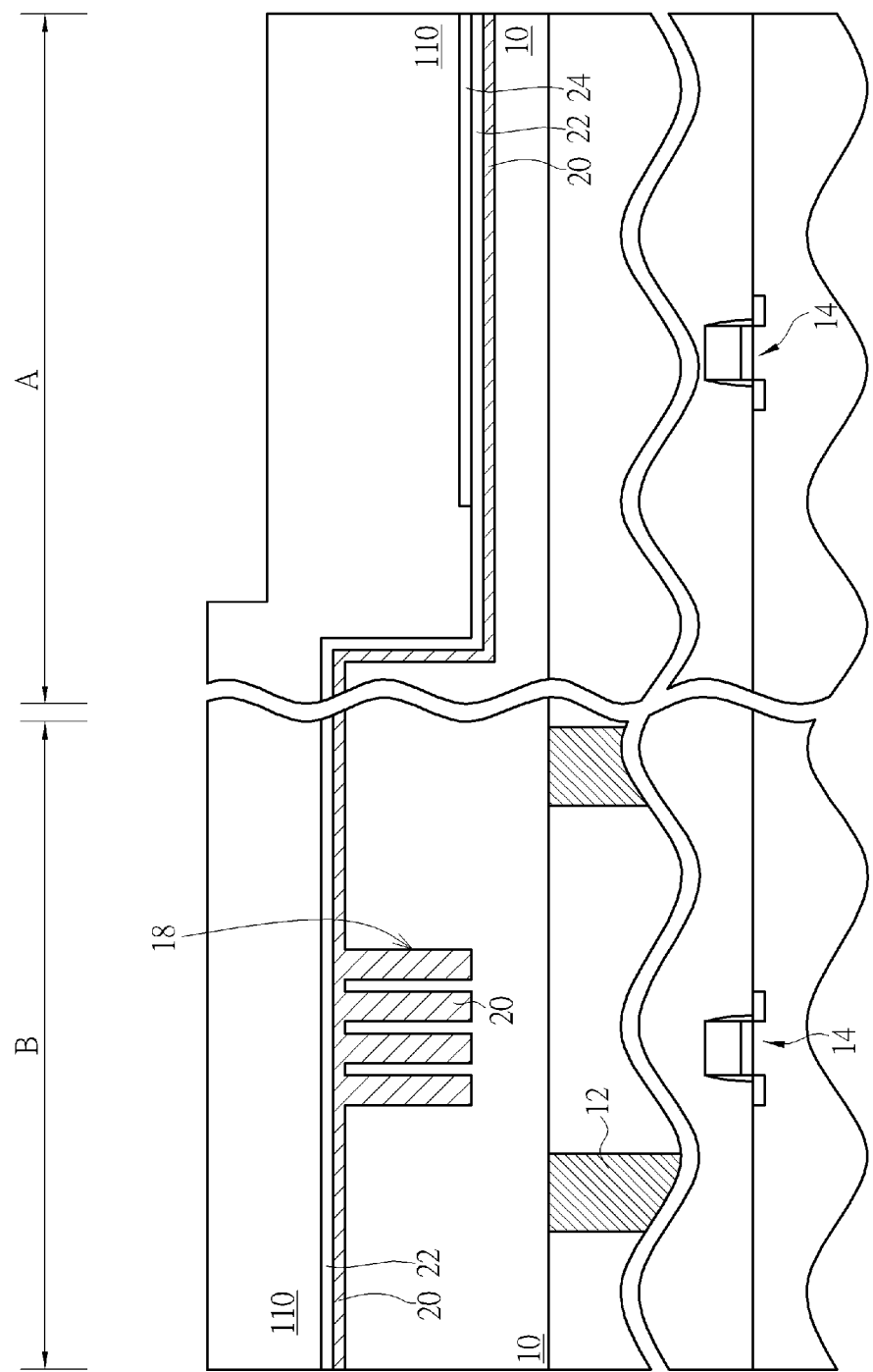
Figure 11:
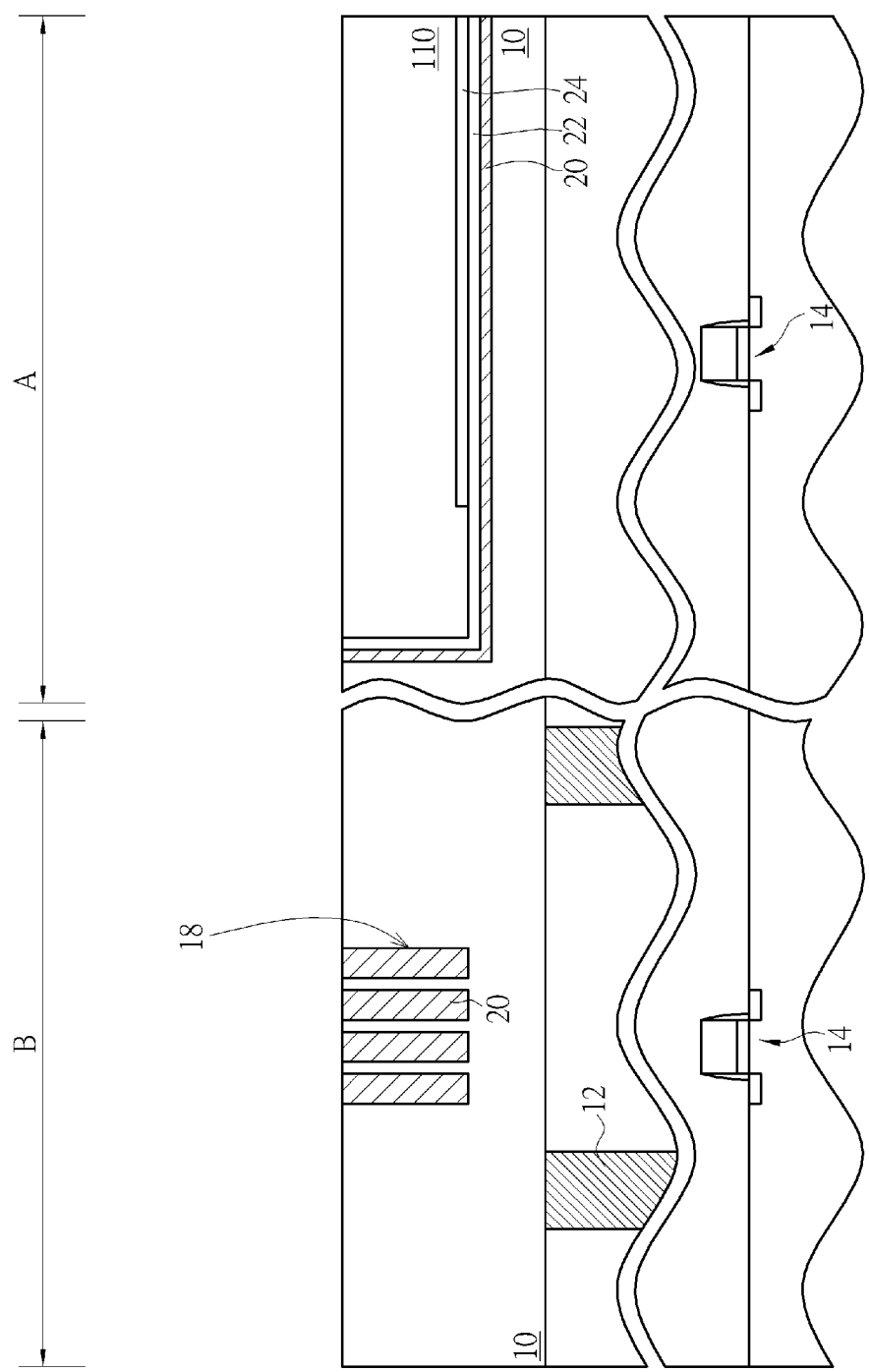

As shown in FIG. 10, the conductive layer 24 within the inductor region B is removed entirely, and part of the conductive layer 24 within the capacitor region A is removed to leave part of the conductive layer 24 within the capacitor region A. In another embodiment, only part of the conductive layer 24 within the capacitor region A is removed to expose part of the insulating layer 22 within the capacitor region A. After that, a dielectric layer 110 is formed to cover and contact the conductive layer 24 within the capacitor region A and also cover and contact the insulating layer 22 within the inductor region B. As shown in FIG. 11, part of the dielectric layer 110, part of the magnetic material 20 within the inductor region B, the entire insulating layer 22 and the entire conductive layer 24 within the inductor region B are removed to expose the magnetic material 20 in the second trenches 18. The dielectric layer 110, the magnetic material 20, the insulating layer 22, and the conductive layer 24 can be removed by chemical mechanical planarization or other suitable processes.

Figure 12:
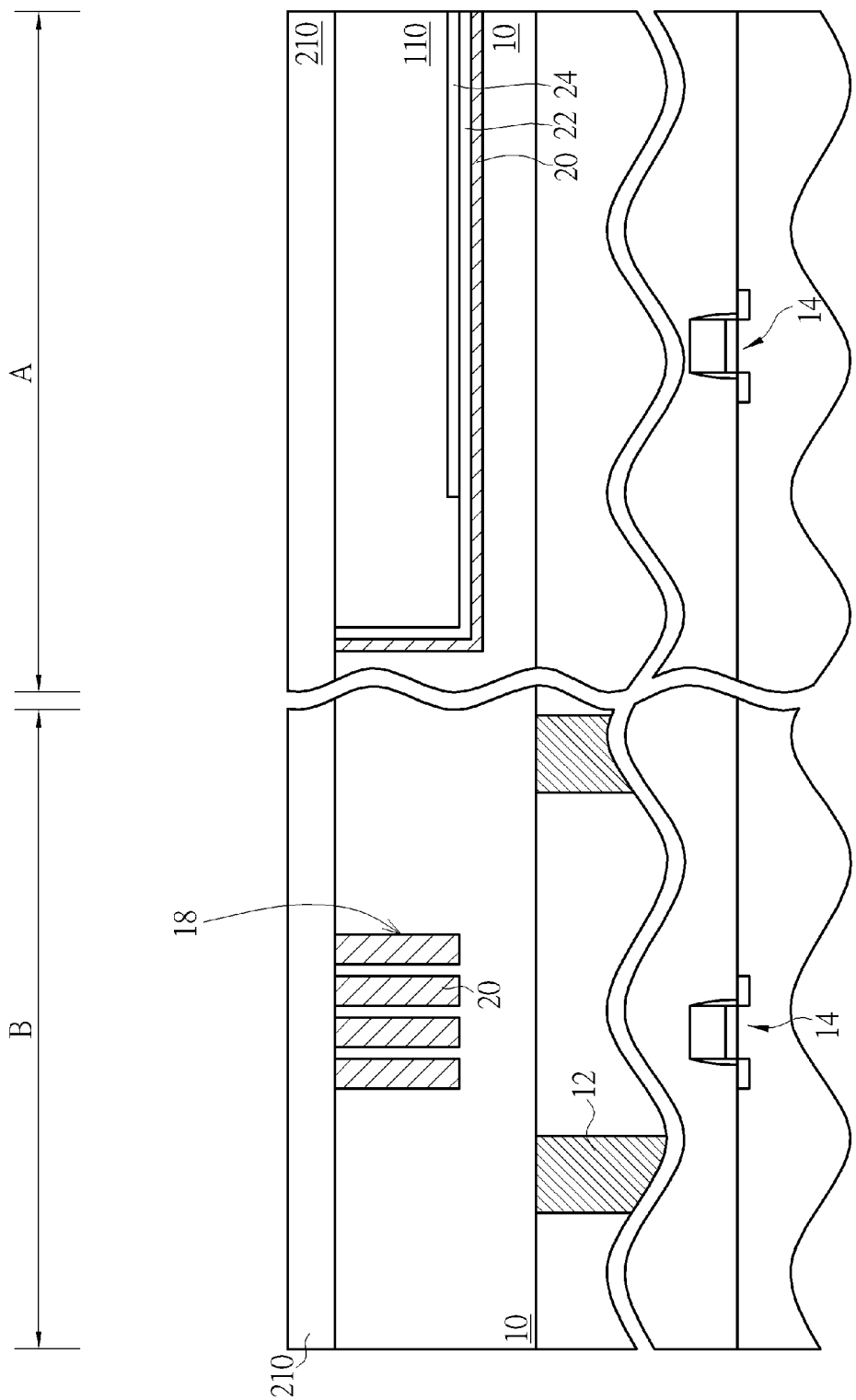

As shown in FIG. 12, a dielectric layer 210 is formed to cover the dielectric layers 10/110. The dielectric layer 210 can be used to protect the magnetic material 20 within the second trenches 18 from being damaged in the following etching step.

Figure 13:
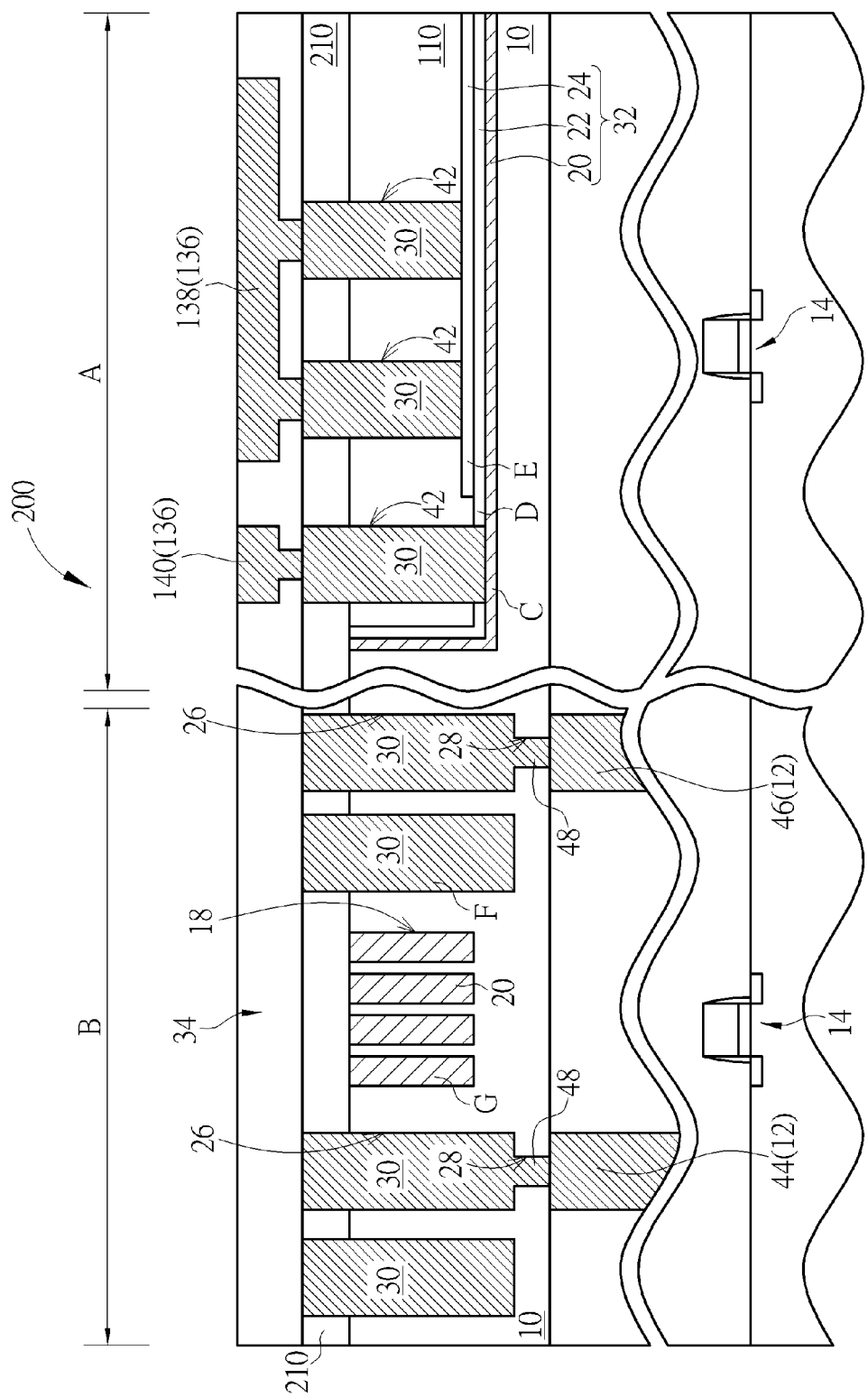

As shown in FIG. 13, part of the dielectric layers 10/110/210 are removed to form a third trench 26 in the dielectric layers 10/210 within the inductor region B, and to form numerous fourth trenches 42 in the dielectric layers 110/210 within the capacitor region A. Please refer to FIG. 14. The third trench 26 surrounds the second trenches 18 in a spiral manner. The second trench is at the center of the spiral. The spiral can be a rectangular spiral, a circular spiral, or an octagonal spiral, etc. Later, a contact hole 28 is formed at the bottom of the third trench 26 and at two ends of the spiral. The metal layer 12 is exposed through the contact hole 28. The third trench 26 and the fourth trenches 42 are preferably formed by a dual damascene process. In addition, because the fourth trenches 42 use the conductive layer 24 or the magnetic material 20 as an etching stop layer respectively, the fourth trenches 42 have different depths. At least one depth of the fourth trench 42 reaches the surface of the magnetic material 20. At least one depth of the fourth trench 42 reaches the surface of the conductive layer 24. Later, a metal layer 30 is formed to fill in the third trench 26, the contact hole 28 and the fourth trenches 42. The metal layer 30 contacts the metal layer 12, the magnetic material 20 and the conductive layer 24. The top surface of the metal layer 30 is aligned with the top surface of the dielectric layer 210. The metal layer 30 filling in the third trench 26 will serve as a wire of the inductor. The metal layer 30 filling in the contact hole 28 will serve as a contact plug 48 which is disposed at two ends of the wire. At this point, the magnetic material 20, the insulating layer 22 and the conductive layer 24 within the capacitor region A constitute a MIM capacitor 32. The magnetic material 20 serves as a bottom electrode C. The insulating layer 22 serves as a capacitor insulating layer D. The conductive layer 24 serves as a top electrode E. The magnetic material 20 and the metal layer 30 filling in the third trench 26 constitute an inductor 34. The magnetic material 20 serves as a core G. The metal layer serves as a wire F.

Later, a metal layer 36 is formed on the dielectric layer 210. The metal layer 36 includes circuits 138 and circuits 140. The circuits 138 electrically connect to the top electrode E of the MIM capacitor 32. The circuits 140 electrically connect to the bottom electrode C of the MIM capacitor 32.

Circuits 44/46 are disposed in the metal layer 12. The contact plugs 48 at two ends of the inductor 34 contact the circuits 44/46 respectively. The metal layer 30 in the fourth trenches 42 contacts the conductive layer 24 and the magnetic material 20. That is, the metal layer 30 in the fourth trenches 42 electrically connects the top electrode E and the bottom electrode C of the MIM capacitor 32.

FIG. 7, FIG. 13 and FIG. 14 are schematic drawings illustrating a structure with an inductor and a MIM capacitor according to a third preferred embodiment of the present invention, wherein like reference numerals are used to refer to like elements throughout. As shown in FIG. 7, a structure with an inductor and an MIM capacitor 100 includes a dielectric layer 10. The dielectric layer 10 is divided into a capacitor region A and an inductor region B. An inductor 34 is disposed within the inductor region B of the dielectric layer 10. A MIM capacitor 32 is disposed in the capacitor region A of the dielectric layer 10. The inductor 34 and the MIM capacitor 32 are both embedded in the dielectric layer 10. The inductor includes a core G and a wire F surrounding the core G. The MIM capacitor 32 includes a top electrode E, a bottom electrode C and a capacitor insulating layer D disposed between the top electrode E and the bottom electrode C. One of the top electrode E and the bottom electrode C comprises a material composing the core G. For example, the material composing the bottom electrode C can be entirely the same as the material composing the core G. The material composing the bottom electrode C may also include the material composing the core G. For instance, the bottom electrode C can include the material composing the core G and a barrier layer (not shown). The barrier layer may be TiN. The material composing the core G preferably includes conductive magnetic materials, ferrites, alloys or other suitable materials. For example, the core G may include ferrites such as MnZn, CuZn, or NiZn. The core G may also include alloys such as Ni—Fe—Mo or Fe—Co—Ni. The core G may also include FeSi, FeAl or FeSiAl.

The wire F of the inductor 34 can be formed by a metal such as copper. The capacitor insulating layer D may include oxide-nitride-oxide (ONO), silicon nitride or other high-K materials. The top electrode E of the capacitor 32 may include Ti, TiN, TaN, Al or other suitable materials.

FIG. 7 and FIG. 13 are schematic drawings illustrating sectional views of an inductor region B along line AA' in FIG. 14. The wire F surrounds core G in a spiral manner. The core G is at the center of the spiral. The wire F does not contact the core G. The spiral can be a rectangular spiral, a circular spiral, or an octagonal spiral, etc. A contact plug 48 is disposed at two ends of the wire F.

A metal layer 12 is disposed under the dielectric layer 10, and a metal layer 36 is disposed on the dielectric layer 10. That is, the inductor 34 and the MIM capacitor 32 are both sandwiched between the metal layer 12 and the metal layer 36. As shown in FIG. 7, the top electrode E of the MIM capacitor is electrically connected to circuits 38 included in the metal layer 36. The bottom electrode C is electrically connected to circuits 13 included in the metal layer 12. An end of the wire F is electrically connected to circuits 40 included in the metal layer 36. The other end of the wire F is electrically connected to circuits 15 included in the metal layer 12. According to another preferred embodiment of the present invention, the MIM capacitor 32 and the inductor 34 can electrically connect to outside signals through different circuit designs. For example, FIG. 13 shows another connecting method to outside signals of the MIM capacitor 32 and the inductor 34. As shown in FIG. 13, a structure with an inductor and an MIM capacitor 200 includes has two ends of the inductor 34 electrically connecting to circuits 44/46 included in the metal layer 12. The top electrode E and the bottom electrode C of the MIM capacitor 32 respectively electrically connect to circuits 138/140 included in metal layer 36. As well as the connecting methods illustrated in FIG. 7 and FIG. 13, circuits on the metal layers 12/36 can have different designs to electrically connect the MIM capacitor 32 and the inductor 34 as long as the signals of the top electrode E, the bottom electrode C and the wire F can be transmitted correctly.

In addition, as shown in FIG. 7, numerous first trenches 16 can be disposed on the capacitor region A of the dielectric layer 10. The top electrode E, the bottom electrode C and the capacitor insulating layer D are disposed in the first trenches 16 so the top electrode E, the bottom electrode C and the capacitor insulating layer D constitute a comb structure. According to another preferred embodiment of the present invention, as shown in FIG. 13, the top electrode E, the bottom electrode C and the capacitor insulating layer D constitute a planar capacitor structure.

Referring again to FIG. 7, the conductive layer 24 in the MIM capacitor 32 can be omitted, and be replaced by taking the metal layer 30 as the top electrode.

The present invention combines the method of fabricating an inductor and a MIM capacitor by utilizing material for forming the core of the inductor to fabricate the bottom electrode of the MIM capacitor. Therefore, the fabricating steps can be decreased and the product costs can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A structure with an inductor and an MIM capacitor, comprising:
    a dielectric layer;
    an inductor disposed within the dielectric layer, the inductor comprising:
        a core; and
        a wire surrounding the core, wherein the wire is in a shape of a spiral; and
    a MIM capacitor disposed within the dielectric layer, the MIM capacitor comprising:
        a top electrode;
        a bottom electrode; and
        an insulating layer disposed between the top electrode and the bottom electrode;
    wherein one of the top electrode and the bottom electrode comprises a material composing the core.

2. The structure with an inductor and an MIM capacitor of claim 1, wherein the bottom electrode comprises the material composing the core.

3. The structure with an inductor and an MIM capacitor of claim 1, wherein the inductor and the MIM capacitor are both embedded within the dielectric layer.

4. The structure with an inductor and an MIM capacitor of claim 1, further comprising a plurality of first trenches disposed in the dielectric layer, wherein the top electrode, the bottom electrode and the insulating layer are disposed in the first trench.

5. The structure with an inductor and an MIM capacitor of claim 1, wherein the top electrode, the bottom electrode and the insulating layer constitute a planar capacitor structure.

6. The structure with an inductor and an MIM capacitor of claim 1, further comprising at least a second trench disposed within the dielectric layer, wherein the core is disposed within the second trench.

7. The structure with an inductor and an MIM capacitor of claim 1, wherein the wire does not contact the core.

8. The structure with an inductor and an MIM capacitor of claim 1, further comprising a first metal layer disposed under the dielectric layer and a second metal layer disposed on the dielectric layer, wherein the inductor and the MIM capacitor are both disposed between the first metal layer and the second metal layer.

9. The structure with an inductor and an MIM capacitor of claim 8, wherein the first metal layer electrically connects the top electrode and the second metal layer electrically connects the bottom electrode.

10. The structure with an inductor and an MIM capacitor of claim 8, wherein the first metal layer comprises a first circuit and a second circuit, the top electrode electrically connects to the first circuit and the bottom electrode electrically connects to the second circuit.

11. The structure with an inductor and an MIM capacitor of claim 8, wherein an end of the wire electrically connects to the first metal layer and another end of the wire electrically connects to the second metal layer.

12. The structure with an inductor and an MIM capacitor of claim 8, wherein the first metal layer comprises a third circuit and a fourth circuit, an end of the wire electrically connects to the third circuit, and another end of the wire electrically connects to the fourth circuit.

13. The structure with an inductor and an MIM capacitor of claim 1, wherein the material composing the core comprises conductive magnetic materials.

14. The structure with an inductor and an MIM capacitor of claim 1, wherein the bottom electrode and the core are formed by the same fabricating step.

* * * * *